United States Patent
Umamichi

(10) Patent No.: US 11,881,806 B2
(45) Date of Patent: Jan. 23, 2024

(54) RESOLVER CONVERTER AND MOTOR CONTROL DEVICE

(71) Applicant: RENESAS ELECTRONICS CORPORATION, Tokyo (JP)

(72) Inventor: Takashi Umamichi, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 485 days.

(21) Appl. No.: 17/208,757

(22) Filed: Mar. 22, 2021

(65) Prior Publication Data
US 2022/0302858 A1    Sep. 22, 2022

(51) Int. Cl.
H03M 1/48 (2006.01)
H02P 6/16 (2016.01)
H02K 24/00 (2006.01)
H03M 1/64 (2006.01)
H02P 27/04 (2016.01)
G01D 5/20 (2006.01)

(52) U.S. Cl.
CPC ............. H02P 6/16 (2013.01); H02K 24/00 (2013.01); H02P 27/045 (2013.01); H03M 1/645 (2013.01); G01D 5/2046 (2013.01)

(58) Field of Classification Search
CPC ....... H02K 24/00; H02P 27/045; H03M 1/645
See application file for complete search history.

(56) References Cited

U.S. PATENT DOCUMENTS 10,797,623 B2    10/2020    Watanabe
2003/0106738 A1*    6/2003    Yoneda ............... B62D 5/0457
                                                                            180/446

FOREIGN PATENT DOCUMENTS

JP    2019-115094 A    7/2019

OTHER PUBLICATIONS

Bashir Mahdi Ebrahimi et al., "Static-, Dynamic-, and Mixed-Eccentricity Fault Diagnoses in Permanent-Magnet Synchronous Motors", IEEE Transactions On Industrial Electronics, vol. 56, No. 11, Nov. 2009.
Anno Yoo et al., "Novel Speed and Rotor Position Estimation Strategy Using a Dual Observer for Low-Resolution Position Sensors", IEEE Transactions On Power Electronics, vol. 24, No. 12, Dec. 2009.

* cited by examiner

*Primary Examiner* — Joseph J Lauture
(74) *Attorney, Agent, or Firm* — Rimon, P.C.

(57) ABSTRACT

A resolver converter includes a tracking loop circuit that calculates an angle θ from a resolver output signal, a control and diagnosis circuit that controls the tracking loop circuit and diagnoses based on the resolver output signal, wherein the control and diagnosis circuit, by operating the tracking loop circuit as a direct digital synthesizer (DDS), synchronously detects a noise signal superimposed on the resolver output signal.

13 Claims, 14 Drawing Sheets

FIG. 11

| Motor angle (deg) | Pseudo hall sensor signal extracted from resolver | A | B | C | D | E | K | L | M | N |
|---|---|---|---|---|---|---|---|---|---|---|
| 0 to 90 | 1-phase | Positive phase | Positive phase | Positive phase | 1 | 1 | 1 | 0 | 0 | 0 |
| 90 to 180 | 2-phase | Positive phase | Positive phase | Negative phase | 1 | 0 | 0 | 1 | 0 | 0 |
| 180 to 270 | 3-phase | Positive phase | Negative phase | Negative phase | 0 | 1 | 0 | 0 | 1 | 0 |
| 270 to 360 | 4-phase | Positive phase | Negative phase | Positive phase | 0 | 0 | 0 | 0 | 0 | 1 |

RESOLVER CONVERTER AND MOTOR CONTROL DEVICE

BACKGROUND

The present invention relates to a resolver converter and a motor control device for processing an output signal of a resolver for detecting a rotation angle of a motor.

THE BACKGROUND OF THE INVENTION

Resolver and resolver converters are widely used to calculate the rotation angle of a motor for automobile and industrial use. Patent Document 1 describes a technique for detecting abnormal vibrations of a motor from the rotational angle of the motor.

Non-Patent Document 1 describes a fault analysis technique for motor eccentricity. Non-Patent Document 2 describes a technique for estimating the rotational angle of a motor (rotor).

PRIOR-ART DOCUMENT

Patent Document

[Patent Document 1] Japanese Unexamined Publication Laid-Open No. 2019-115094

Non-Patent Document

[Non-Patent Document 1] Bashir Mandi Ebrahimi and two others, "Static-, Dynamic-, and Mixed-Eccentricity Fault Diagnoses in Permanent-Magnet Synchronous Motors", IEEE TRANSACTIONS ON INDUSTRIAL ELECTRONICS, VOL. 56, NO. 11, NOVEMBER 2009

[Non-Patent Document 2] Anno Yoo and three others, "Novel Speed and Rotor Position Estimation Strategy Using a Dual Observer for Low-Resolution Position Sensors", IEEE TRANSACTIONS ON POWER ELECTRONICS, VOL. 24, NO. 12, DECEMBER 2009

SUMMARY

Motors are used for various applications in automobile and industrial applications. The output signal of the resolver is contaminated with noise due to damage generated in the motor. In order to detect this noise accurately, it is necessary to perform frequency analysis on the resolver output signal. Frequency analysis requires a Fourier transform circuit (or a high-speed CPU for performing Fourier transform) and a high-speed Analog-to-Digital circuit. This causes a problem of increasing a circuit size of the motor control device including the resolver converter. Other objects and novel features will become apparent from the description of the specification and drawings.

A resolver converter according to an embodiment includes a tracking loop circuit that calculates an angle θ from a resolver output signal, a control and diagnosis circuit that controls the tracking loop circuit and diagnoses based on the resolver output signal, wherein the control and diagnosis circuit, by operating the tracking loop circuit as a direct digital synthesizer (DDS), synchronously detects a noise signal superimposed on the resolver output signal.

In the resolver converter according to the embodiment, it is possible to detect the noise (damage wave) superimposed on the resolver without increasing the circuit size.

BRIEF DESCRIPTION OF THE DRAWINGS

FIG. 11 is a table for explaining the operation of the motor control device according to fourth embodiment.

DETAILED DESCRIPTION

Figure 1:
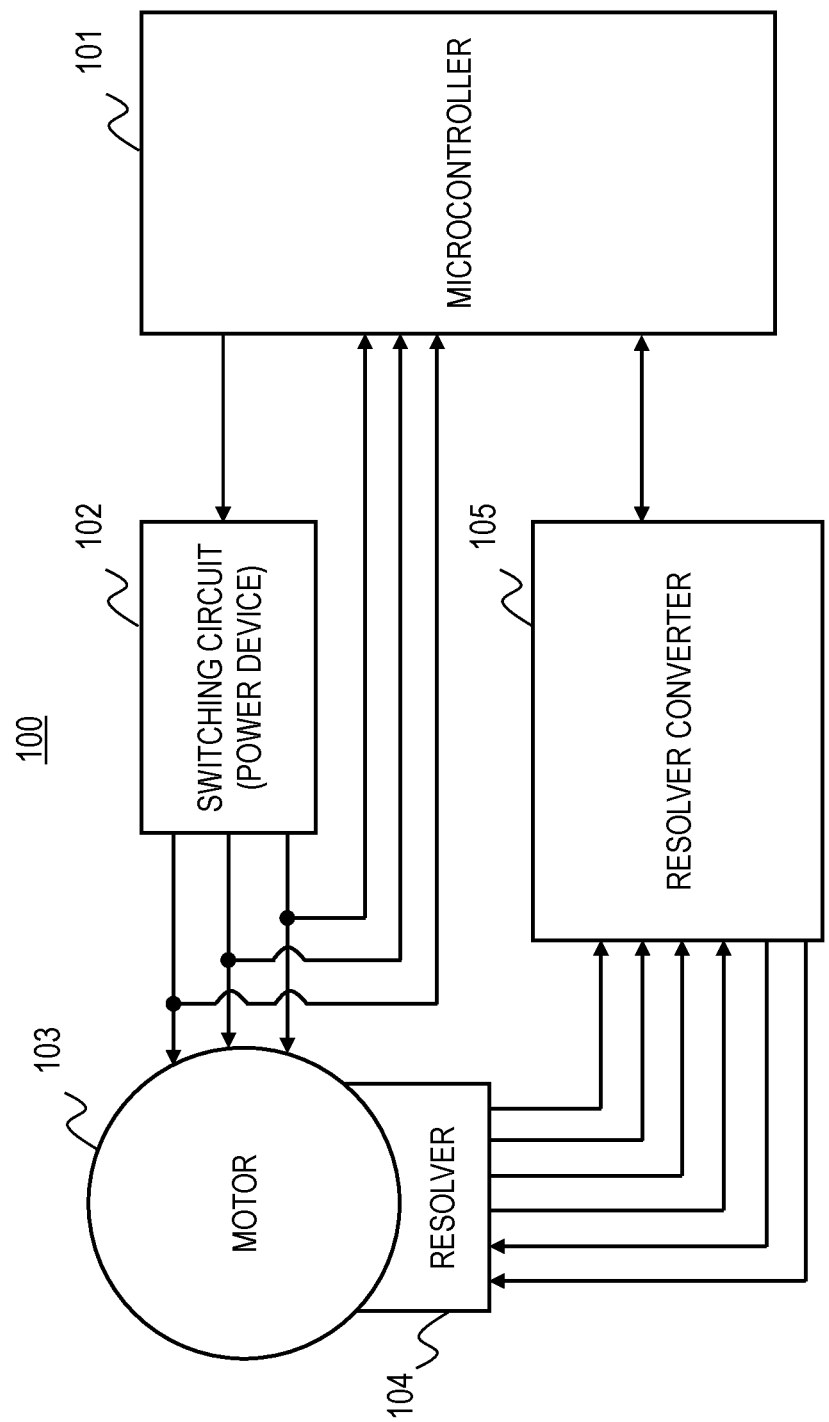
FIG. 1 is a block diagram of the motor control device according to first embodiment.

Hereinafter, a semiconductor device according to an embodiment will be described in detail by referring to the drawings. In the specification and the drawings, the same or corresponding form elements are denoted by the same reference numerals, and a repetitive description thereof is omitted. In the drawings, for convenience of description, the configuration may be omitted or simplified. Also, at least some of the embodiments may be arbitrarily combined with each other.

First Embodiment

FIG. 1 is a block diagram showing a configuration of a motor control device 100 according to first embodiment. As shown in FIG. 1, the motor control device 100 has a Microcontroller 101, a Switching circuit (Power device) 102, a Motor 103, a Resolver 104 and a Resolver converter 105.

Switching circuit 102 receives an instruction from Microcontroller 101 and generates a current for driving Motor 103. For example, by control by PWM (Pulse Width Modulation), Switching circuit 102 generates three-phase currents for driving Motor 103.

Resolver 104 is a sensor for detecting the rotational angle of Motor 103. Resolver 104 outputs a signal corresponding to the rotational angle of Motor 103.

Resolver converter 105 calculates the rotation angle of Motor 103 from the signal outputted from Resolver 104, and transmits the calculated rotation angle to Microcontroller 101.

Microcontroller 101 controls Motor 103 to perform a desired rotation based on the current values of the three-phase currents flowing through Motor 103 and the rotation angle calculated by Resolver converter 105.

Present first embodiment is characterized by Resolver converter 105. Since Microcontroller 101, Switching circuit 102 and Resolver 104 are conventional circuits, detailed explanations will be omitted.

Figure 2:
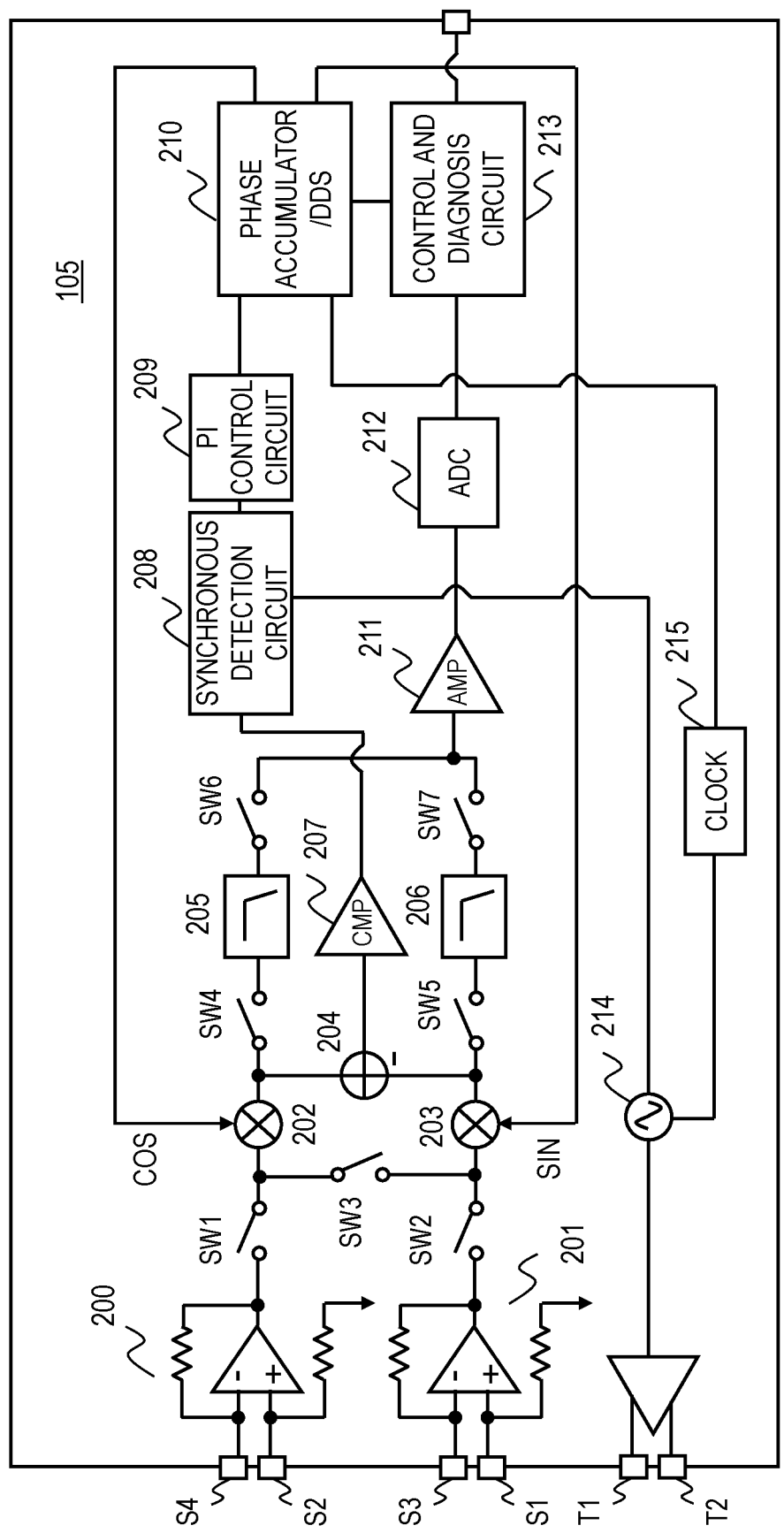
FIG. 2 is a block diagram of a Resolver converter according to first embodiment.

FIG. 2 is a schematic diagram of the Resolver converter 105. As shown in FIG. 2, Resolver converter 105 includes differential amplifier circuits 200, 201, multipliers 202, 203, a subtractor 204, low-pass filters 205, 206, a comparator 207, a Synchronous detection circuit 208, a PI control circuit 209, a Phase accumulator and DDS circuit (Phase accumulator/DDS) 210, an instrumentation amplifier 211, an Analog-to-Digital converter 212, a Control and diagnosis circuit 213, an excitation source 214, a clock generator 215, and switches SW1 to SW7.

Differential amplifiers 200 and 201 amplify the output signals of Resolver 104. Multiplier 202 multiplies the output signal of the differential amplifier 200 and the output signal (COS signal) of Phase accumulator/DDS 210. Multiplier 203 multiplies the output signal of the differential amplifier 201 and the output signal (SIN signal) of Phase accumulator/DDS 210. Subtractor 204 subtracts the output signal of the multiplier 203 from the output signal of the multiplier 202. Comparator 207 encodes the output signal of the subtractor 204 for synchronous detection. Synchronous detection circuit 208, based on the output signal of the comparator 207, performs synchronous detection. PI control circuit 209 performs PI control (Proportional control and Integral control) based on the output signal of Synchronous detection circuit 208.

Phase accumulator/DDS 210 has two functions. The first function is to integrate the output signal (angular deviation) of PI control circuit 209 (acts as a Phase accumulator). The second function is to generate a diagnostic signal for detecting noise (e.g. noise caused by bearing damages of the motor) superimposed on the output signal of Resolver 104 (acts as a DDS: Direct Digital Synthesizer).

Low-pass filter 205 is for extracting a DC value from the output signal of the multiplier 202. Low-pass filter 206 is for extracting a DC value from the output signal of the multiplier 203. Instrumentation amplifier 211 is for amplifying the output signal of the low-pass filters 206 and 207. ADC 212 performs analog-to-digital conversion on the output signal of the instrumentation amplifier 211. Control and diagnosis circuit 213 determines the presence or absence of noises superimposed on the output signal of Resolver 104 based on the output signal of ADC 212. Control and diagnosis circuit 213 also controls the switches SW1 to SW7.

Excitation signal source 214 generates an excitation signal of Resolver 14. CLOCK generator 215 generates a clock for operating Phase accumulator/DDS 210 based on the output of the Excitation signal source 214.

Figure 3:
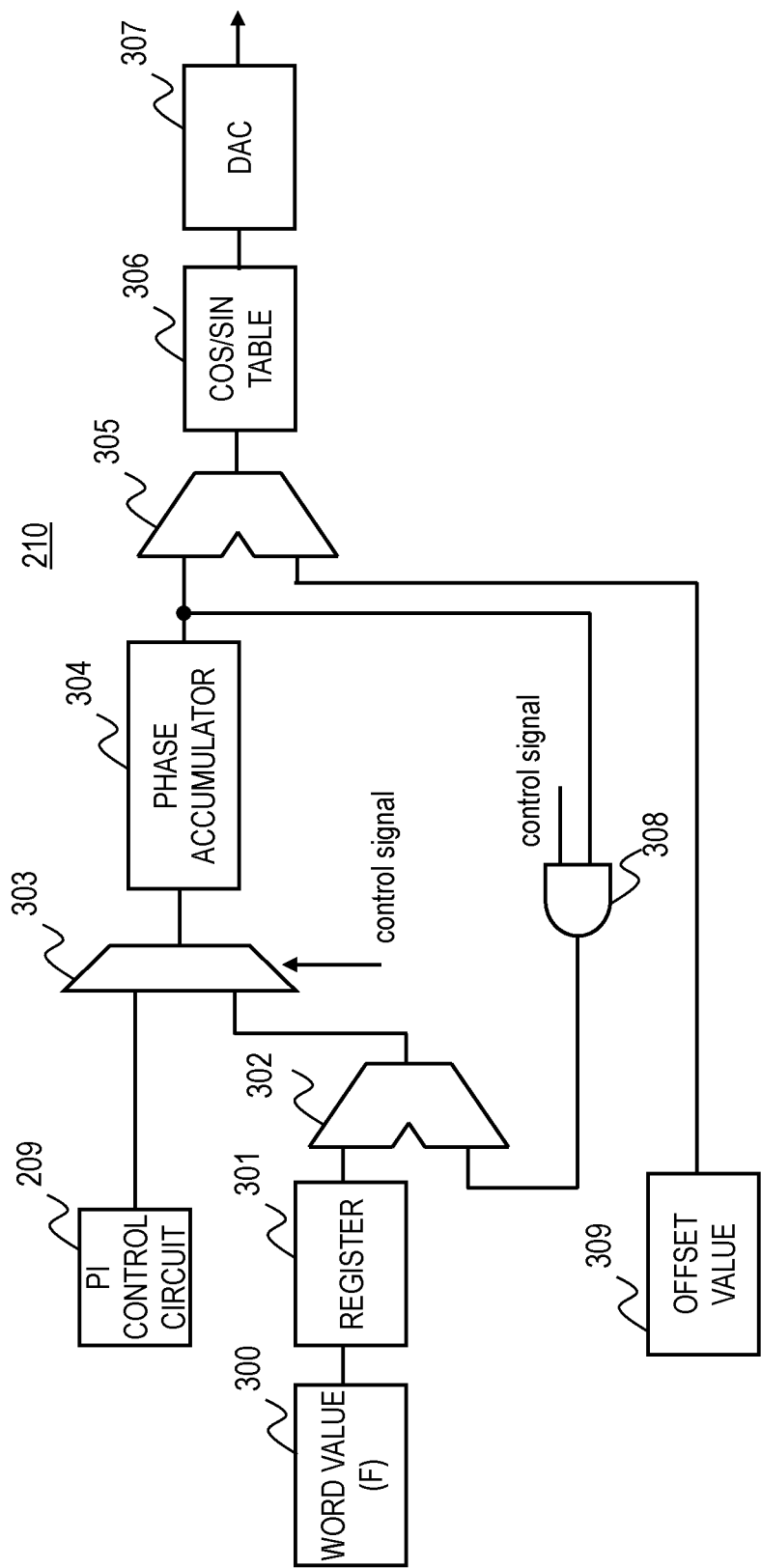
FIG. 3 is a block diagram of a Phase accumulator/DSS according to first embodiment.

FIG. 3 is a schematic diagram of the Phase accumulator/DDS 210. As shown in FIG. 3, Phase accumulator/DDS 210 includes a register 301 for storing a specified frequency value F (Word value 300), adders 302 and 305, a selector 303, a Phase accumulator 304, a COS/SIN table 306, a Digital-to-Analog converter 307, an AND-circuit 308, and an Offset value (register) 309. In FIG. 3, "control signal" denotes control signals outputted from control and diagnosis circuit 213.

Phase accumulator/DDS 210 has a normal mode and a diagnostic mode that are switched by control signal. In the normal mode, the selector 303 outputs an output signal of PI control circuit 209 to Phase accumulator 304. That is, in the normal mode, PI control circuit 209, Phase accumulator 304, the adder 305, Offset value 309, COS/SIN table 306 and DAC 307 are operated. At this time, Phase accumulator/DDS 210 operates as a Phase accumulator. In the diagnostic mode, the selector 303 outputs an output signal of the adder 302 to Phase accumulator 304. That is, in the diagnostic mode, the frequency value F 300, register 301, adder 302, Phase accumulator 304, AND circuit 308, adder 305, Offset value 309, COS/SIN table 306 and DAC 307 are operated. At this time, Phase accumulator/DDS 210 operates as a DDS. Details will be described later.

Next, the operation of the motor control device 100 will be described with reference to FIGS. 1 to 5. Since the first embodiment is characterized by Resolver converter 105, the operation of Resolver converter 105 will be mainly described.

First, the operation in the normal mode will be described. In the normal mode, Resolver converter 105 calculates the rotational angle of Motor 103 based on the output signal of Resolver 104. In the normal mode, Control and diagnosis circuit 213 turns on SW1 and SW2, turns off SW3 to SW7, and causes the selector 303 to select PI control circuit 209. At this time, with respect to the output signal of Resolver 104, a tracking loop is formed by the multipliers 202 and 203, the subtractor 204, the comparator 207, and Synchronous detection circuit 208, PI control circuit 209 and Phase accumulator/DDS 210.

When the excitation signal of Resolver 104 (the output signal of the excitation signal source 214) is E0*sin (ω*t), the following signals are input to the input terminals S1 to S4 of Resolver converter 105.

$$S3-S1=T*E0*\sin(\omega*t)*\sin\theta \qquad \text{Expression (1)}$$

$$S4-S2=T*E0*\sin(\omega*t)*\cos\theta \qquad \text{Expression (2)}$$

Where T is the transformation ratio of Resolver 104 and θ is the rotational angle of Motor 103.

Differential amplifiers 200 and 201 amplify the input signals. When the angle calculated by the tracking loop is φ, the signal output by Phase accumulator/DDS 210 is cos φ and sin φ. At this time, the following processing is performed by the multipliers 202, 203 and the subtractor 204 (amplification degrees of the differential amplifiers 200 and 201, T and E0 are omitted).

$$\sin\theta*\sin(\omega*t)*\cos\varphi*\cos\theta*\sin(\omega*t)*\sin\varphi = $$
$$\sin(\theta-\varphi)*\sin(\omega*t) \approx (\theta-\varphi)*\sin(\omega*t)$$

Comparator 207 performs binarization of the signal. Synchronous detection circuit 208 performs synchronous detection using a synchronous detection clock (the binarized signal) with respect to the output signal of the comparator 207. A phase difference between θ and φ can be detected by the synchronous detection. The tracking loop adjusts φ so that the phase difference between θ and φ becomes 0 by PI control. Finally obtained φ is the rotational angle of Motor 103.

Figure 4:
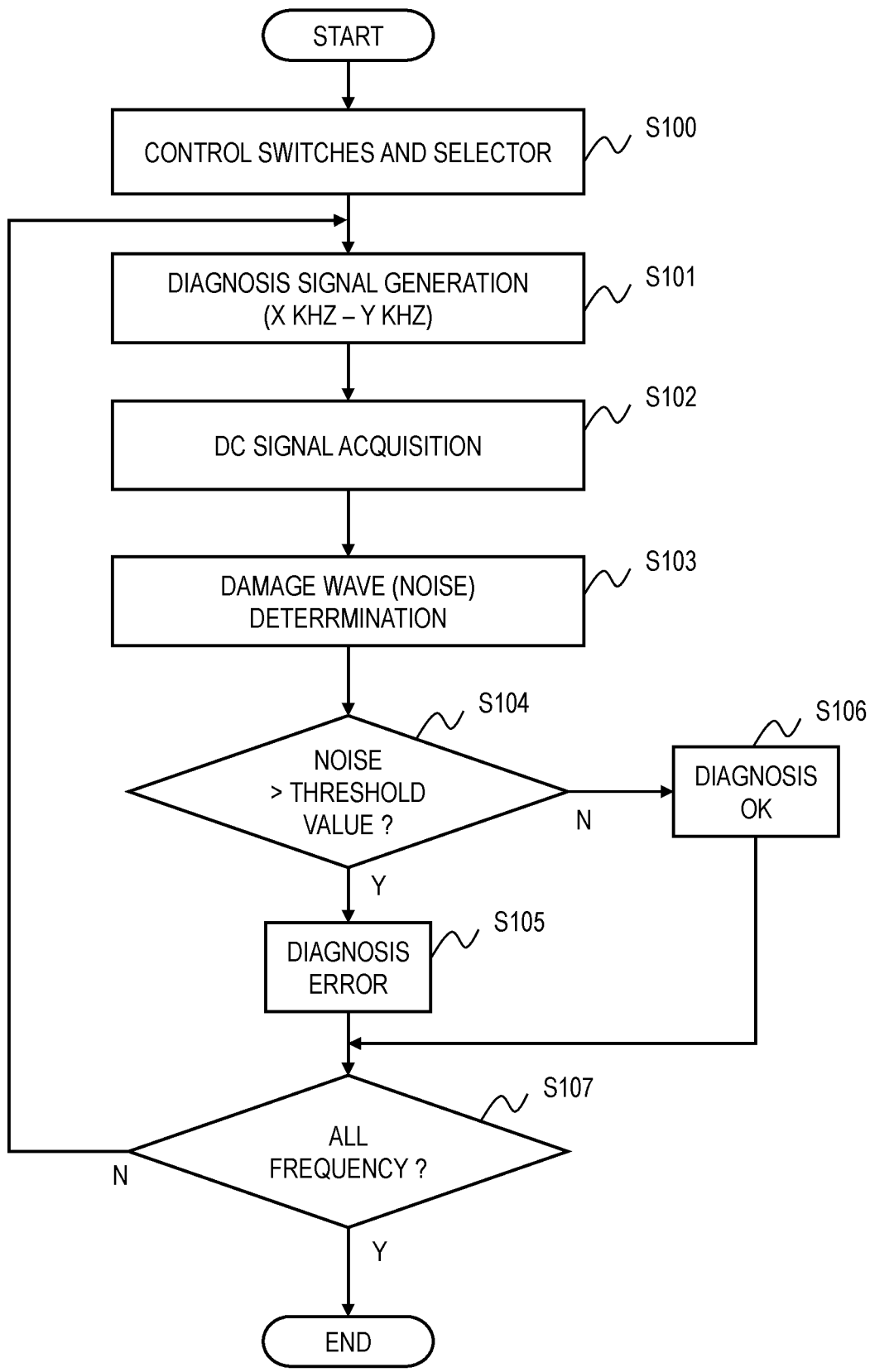
FIG. 4 is a flowchart for explaining the operation of the motor control device according to first embodiment.
Figure 5:
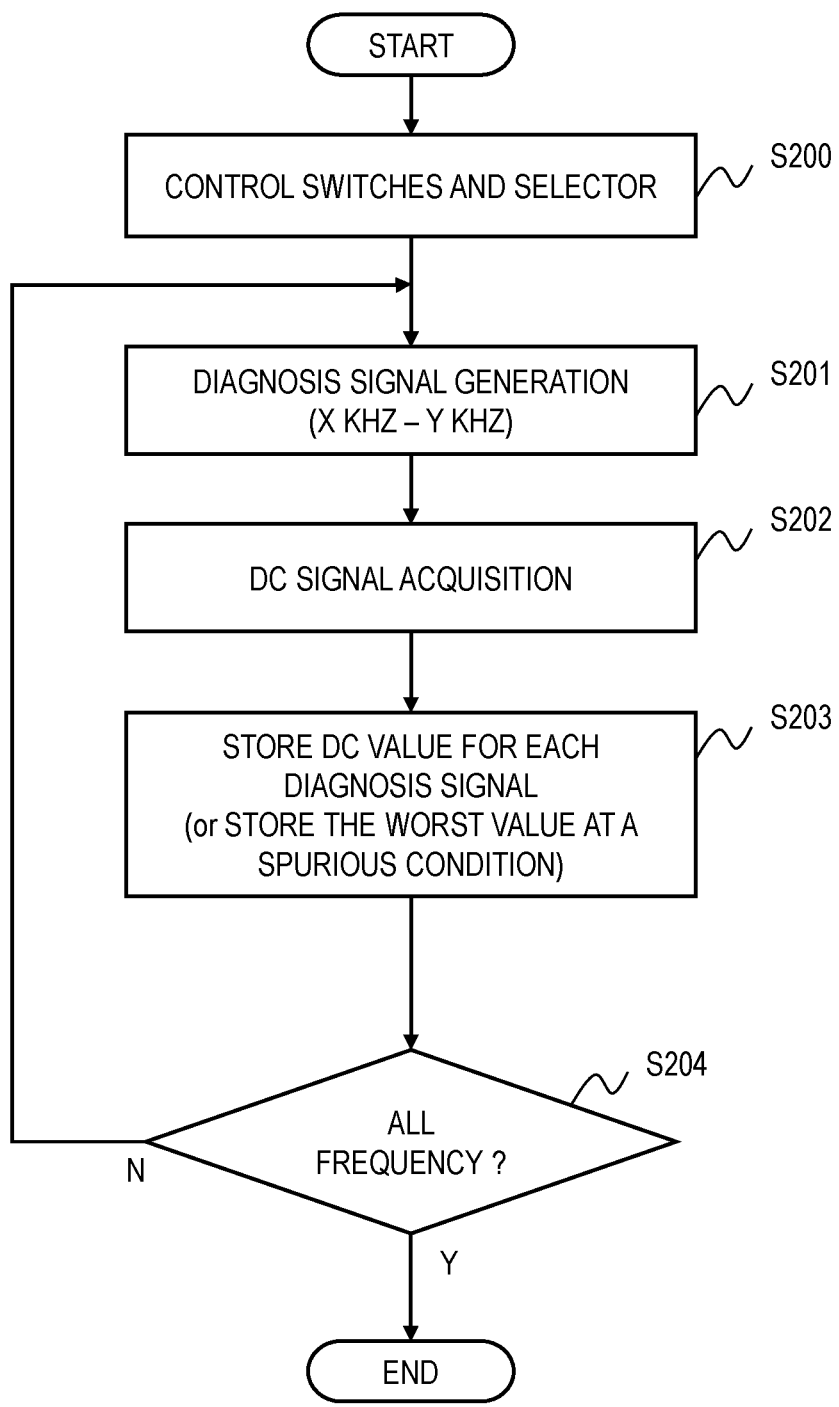
FIG. 5 is a flow chart for explaining the operation of the motor control device according to first embodiment.

Next, the operation in the diagnostic mode will be described with reference to FIGS. 1 to 5. FIG. 4 is a flow chart for explaining the operation of the motor control device 100 in the diagnostic mode. Diagnostic mode is a mode in which Resolver converter 105 detects the failure of Motor 103 by detecting the noise superimposed on the output signal of Resolver 104.

First, a case in which diagnosing is performed using signals output from Resolver 104 to the input terminals S1 and S3 will be described. Control and diagnosis circuit 213 turns on SW1, SW3 to SW7, turns off SW2, and causes the selector 303 to select the output-signal of the adder 302 (step S100).

Here, assume that the bearing of Motor 103 is damaged. Damage waves (noises) are superimposed on the output signal of Resolver 104 due to damages occurring in the bearing. This damage wave can be expressed as sin(ωf*t+α). α is the phase difference between a diagnostic signal COS wave (described later) of Resolver converter 105 and the damage wave. Assuming that the angular velocity of Motor 103 is ωm, Expression (1) becomes as follows (T and E0 are omitted).

$$S3 - S1 = \{\sin(\omega m * t) + \sin(\omega f * t + \alpha)\} * \sin(\omega * t) =$$
$$-1/2\{\cos(\omega m * t + \omega * t) - \cos(\omega m * t - \omega * t)\} -$$
$$1/2\{\cos(\omega f * t + \alpha + \omega * t) - \cos(\omega f * t + \alpha - \omega * t)\}$$

Expression (3)

Expression (3) includes an upper sideband and a lower sideband centering on the excitation signal. The spectrum of the waveform is an impulse centered on ω and sidebands of ±ωm and ±ωf. Here, a case in which Resolver converter 105 diagnoses the upper sideband (½ cos(ωf*t+α+ω*t)) will be described. Resolver converter 105 operates Phase accumulator/DDS 210 as a DDS and causes the DDS to generate diagnostic signals. Assume that the diagnostic signals (orthogonal signals) are cos(ωd*t) and sin(ωd*t). The input signal is processed by the multipliers 202 and 203 as follows.

Upper sideband signal * quadrature signal =  Expression (4)

$$1/2\{(\cos(\omega f * t + \alpha + \omega * t) * \cos(\omega d * t) +$$
$$j * (\cos(\omega f * t + \alpha + \omega * t) * \sin(\omega d * t)\} =$$
$$1/2 * 1/2[\cos(\omega f * t + \alpha + \omega * t + \omega d * t) +$$
$$\cos(\omega f * t + \alpha + \omega * t - \omega d * t) + j * \{\sin$$
$$(\omega f * t + \alpha + \omega * t + \omega d * t) + \sin(\omega f * t + \alpha + \omega * t - \omega f * t)\}]$$

Since cos ωd*t and sin ωd*t are signal paths different from each other, sin ωd*t is expressed by an imaginary number j as a mathematical expression.

Resolver converter 105 detects the damage wave by changing ωd (step S10). That is, if ωf+ω=ωd is satisfied in Expression (4) in the process of changing ωd, Expression (4) becomes the following expression.

¼[cos(2ωd*t+α)+cos(α)+j*{sin(2ωd*t+α)+sin(α)}]   Expression (5)

When the harmonic components of the expression (5) are removed by the low-pass filters 205 and 206, the expression (5) becomes cos α+j*sin α. This signal becomes a DC signal. This signal, after being amplified by the instrumentation amplifier 211, is converted to a digital value by ADC 212. The converted digital value is transmitted to Microcontroller 101 by Control and diagnosis circuit 213 (step S102). Microcontroller 101 determines whether the damage wave has been detected by the transmitted digital wave (step S103). That is, if the digital value indicates a predetermined value, it means that the detection of the damage wave could be performed (ωf+ω=ωd). Control and diagnosis circuit 213 may determine whether the damage wave has been detected. In order to make this determination, Microcontroller 101 (or Control and diagnosis circuit 213) performs the detection in advance in a state in which Motor 103 is not damaged and is rotating at a predetermined speed (initial measurement result; see FIG. 5). By comparing the digital value obtained by the initial measurement result with the digital value obtained by the diagnostic mode, the damage wave can be detected. That is, at a specific frequency, if the digital value obtained in the diagnostic mode is larger than the digital value of the initial measurement result, it can be determined that the damage wave (noise) has occurred.

Microcontroller 101 (or Control and diagnosis circuit 213) determines whether the detected damage wave exceeds a predetermined threshold (step S104). If the damage wave exceeds the threshold value, an error signal is outputted as a diagnostic result (step S105). If the damage wave does not exceed the threshold value, a signal indicating a diagnostic OK is outputted as a diagnostic result (step S106).

The steps S101 to S105 are repeatedly performed for a predetermined diagnostic frequency band (step S107). Although the above description has been made with respect to the input terminals S1 and S3, the same applies to the case where diagnosis is performed with respect to the input terminals S2 and S4. The same applies to a case of diagnosing in the lower sideband.

Now, diagnostic signals cos(ωd*t) and sin(ωd*t) generated by Resolver converter 105 will be described. As described above, Phase accumulator/DDS 210 operates as a DDS in the diagnostic mode. Assuming that a value of Word value 300 is F, a bit-width of Phase accumulator 304 is L, and an operating clock of Phase accumulator/DDS 210 is f. The register 301 sets the F. F is adding to Phase accumulator 304. When a counter value of Phase accumulator 304 is 0, it means 0 degree, and when the counter value is full, it means 360 degrees. COS/SIN table 306 replaces the output value of Phase accumulator 304 with the amplitude value of COS/SIN. The output frequency of the DDS can be expressed as f*F/2^L. The frequency of the signal for diagnosis can be made variable by changing F. For example, when L=25, f=20 MHz, a resolution each per change amount of F-value is 0.6 Hz. When F=16777, the frequency of the diagnosis signal is 10 KHz (0.6*16777). Then, suppose that the frequency of the excitation signal is 10 KHz and the damage wave is 50 Hz. As described above, when Resolver converter 105 generates the diagnosis signal for 10.5 KHz, the damage wave can be detected. Since the operation of the DDS is general, a detailed description thereof will be omitted.

As described above, the motor control device 100 according to first embodiment has the normal mode and the diagnostic mode. In the diagnostic mode, by operating Phase accumulator as the DDS, the damage wave (noise) superimposed on Resolver 104 can be detected without increasing the size of the DDS.

Second Embodiment

The configuration of the motor control device 100 according to second embodiment is the same as that of first embodiment. While the first embodiment diagnoses when Motor 103 is rotating, second embodiment diagnoses whether there is a failure in the signaling path from Resolver 104 to the instrumentation amplifier 211 in Resolver converter 105 when Motor 103 is not rotating.

Next, the operation of the motor control device 100 according to second embodiment will be described. The motor control device 100 according to second embodiment operates in the diagnostic mode described above.

First, Control and diagnosis circuit 213 turns on SW1, SW3 to SW7, turns off SW2, and causes the selector 303 to select the output-signal of the adder 302. Because Motor 103 is not rotating, noise caused by Motor 103 is not superimposed on the output signal of Resolver 104. Therefore, if there is no failure in the signal path from Resolver 104 to the instrumentation amplifier 211 in Resolver converter 105, Resolver converter 105 should perform detection at the same frequency (e.g., 10 KHz) as the excitation signal. If Resolver converter 105 performs detection at a frequency that differs from the excitation signal, it means that there is a failure in the signal path from Resolver 104 to the instrumentation amplifier 211 in Resolver converter 105.

As described above, the motor control device 100 according to the second embodiment can detect a failure of the signal path from Resolver 104 to the instrumentation amplifier 211 in Resolver converter 105 in addition to the effect of first embodiment.

Third Embodiment

Figure 6:
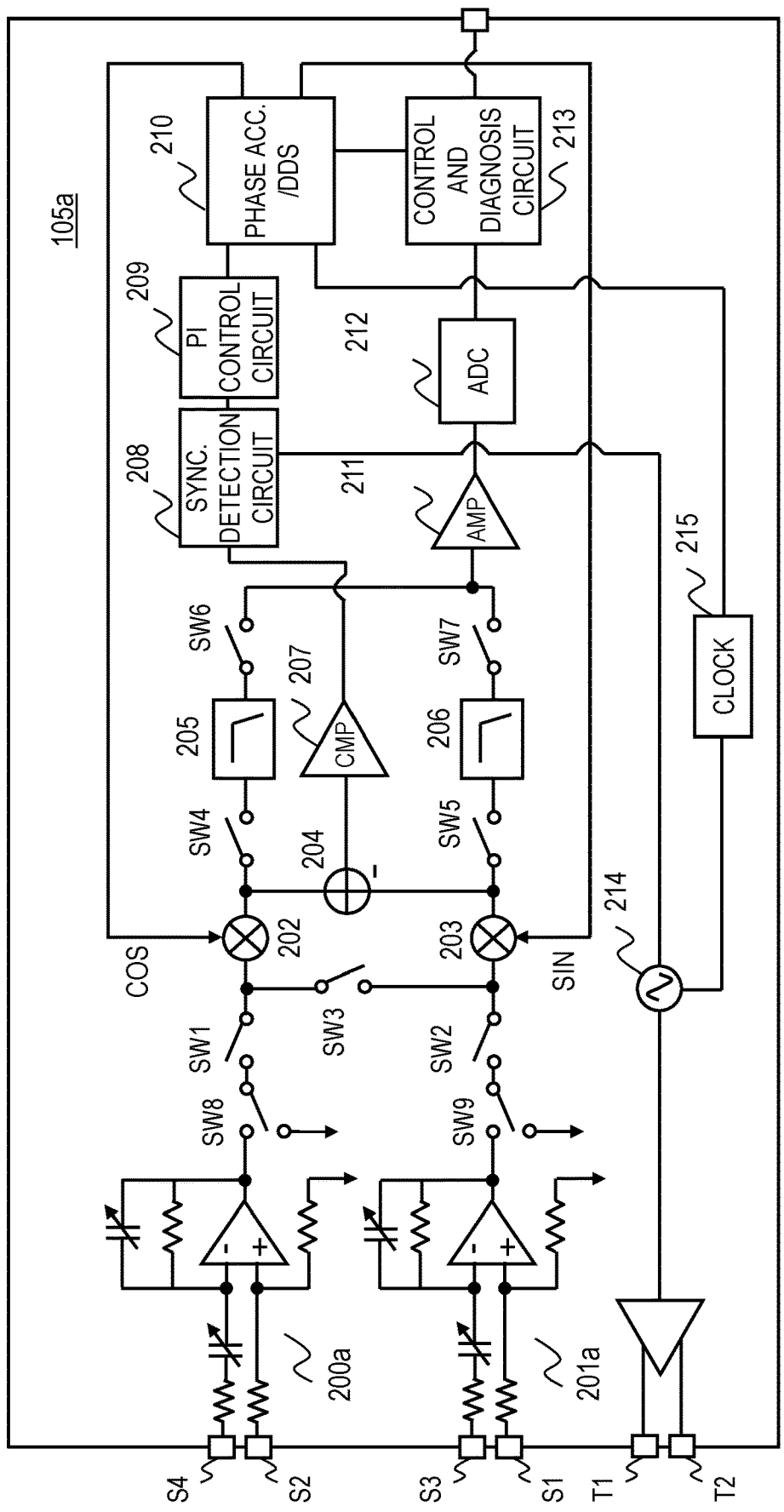
FIG. 6 is a schematic diagram of a Resolver converter according to third embodiment.

FIG. 6 is a block diagram showing a configuration of a Resolver converter 105a according to third embodiment. The difference from first embodiment (FIG. 2) is that the differential amplifiers 200 and 201 are alias filters 200a and 201a. The alias filter operates as a band-pass filter composed of a variable capacitance and a resistor. In addition, a half-wave Phase Sensitive Detector (PSD) is constructed by adding a SW8 and a SW9 for connecting output signals of the alias filters to GND.

In addition to the frequency depending on the rotation of Motor 103, the frequency of various electromagnetic noises of the system is superimposed on the output signal of Resolver 104. By providing the alias filter, it is possible to extract a signal in a band to be observed. By using the variable capacitance, a band-pass filter for a desired band can be obtained.

And, a frequency-conversion function for the output signal of Resolver 104 is obtained by the half-wave PSD. Since the detected signal is frequency-converted to 10 KHz by the excitation signal, it is up-converted to the original detected signal. When performing frequency quadrature synchronous detection, it is decided to match the frequency in the band of 10 KHz. However, interference can be avoided by frequency-converting with one of several frequencies generated by dividing the internal clock when the signal cannot be removed by the alias filter or interferes with the same 10 KHz. In addition, by half-wave PSD switching at the same 10 KHz as the original excitation signal frequency 10 KHz, the resolver signal can be extracted in the frequency band prior to being modulated by the resolver excitation signal. By the orthogonal synchronous detection diagnosis of the frequency of the signal, the synchronous detection can be performed at the frequency of the original band.

As described above, Resolver converter 105a according to the third embodiment can increase the noise-tolerance in addition to first embodiment effects.

Fourth Embodiment

Figure 7:
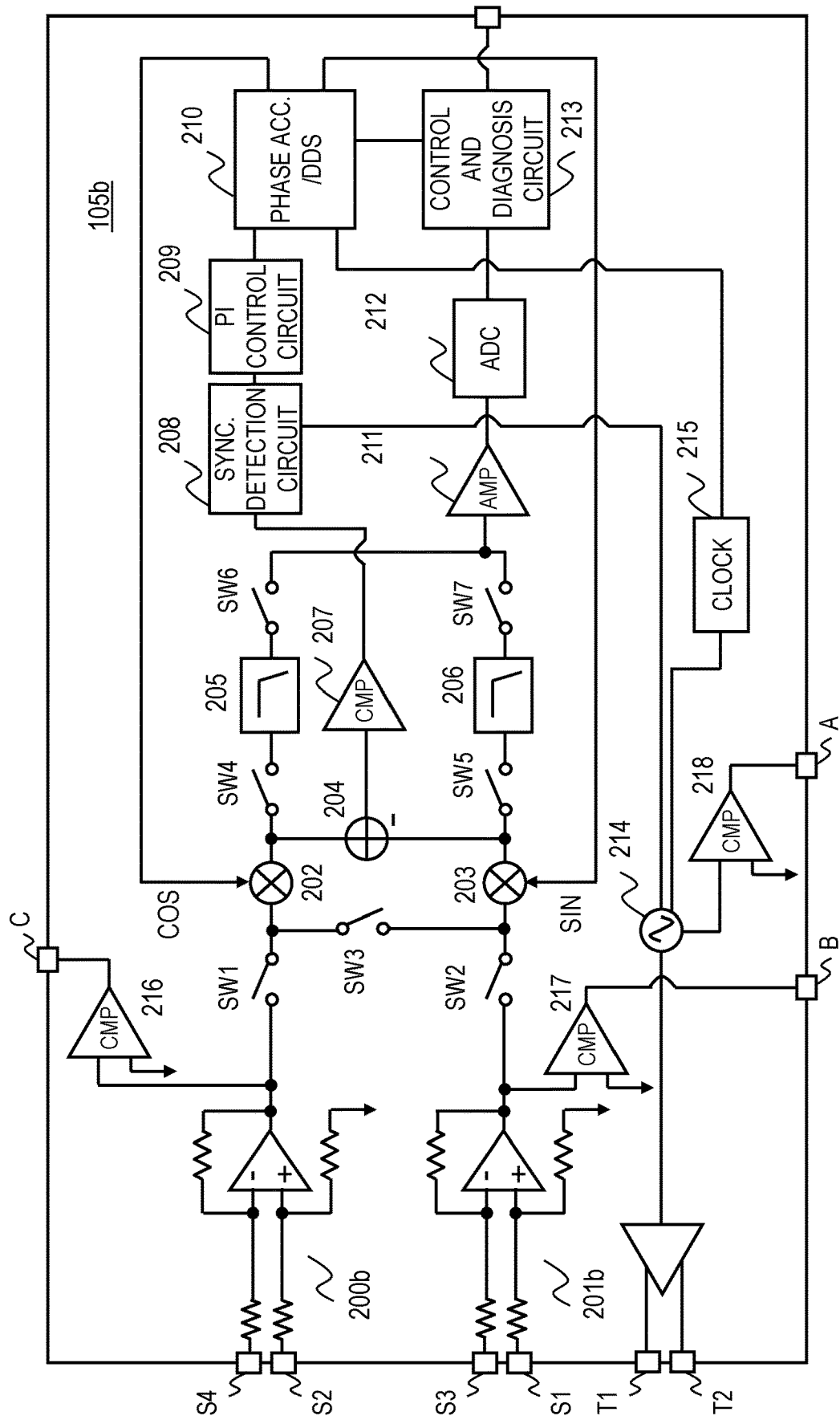
FIG. 7 is a schematic diagram of a Resolver converter according to fourth embodiment.

FIG. 7 is a block diagram showing a configuration of a Resolver converter 105b according to fourth embodiment. Differences from first embodiment are as follows. Resistors are added to the inputs of the differential amplifiers 200 and 201 (differential amplifiers 200b and 201b). Zero-cross detection comparators 216 and 217 are added to the outputs of the differential amplifiers 200b and 201b. A zero-cross detection comparator 218 is added the output of the excitation signal source 214.

Figure 8:
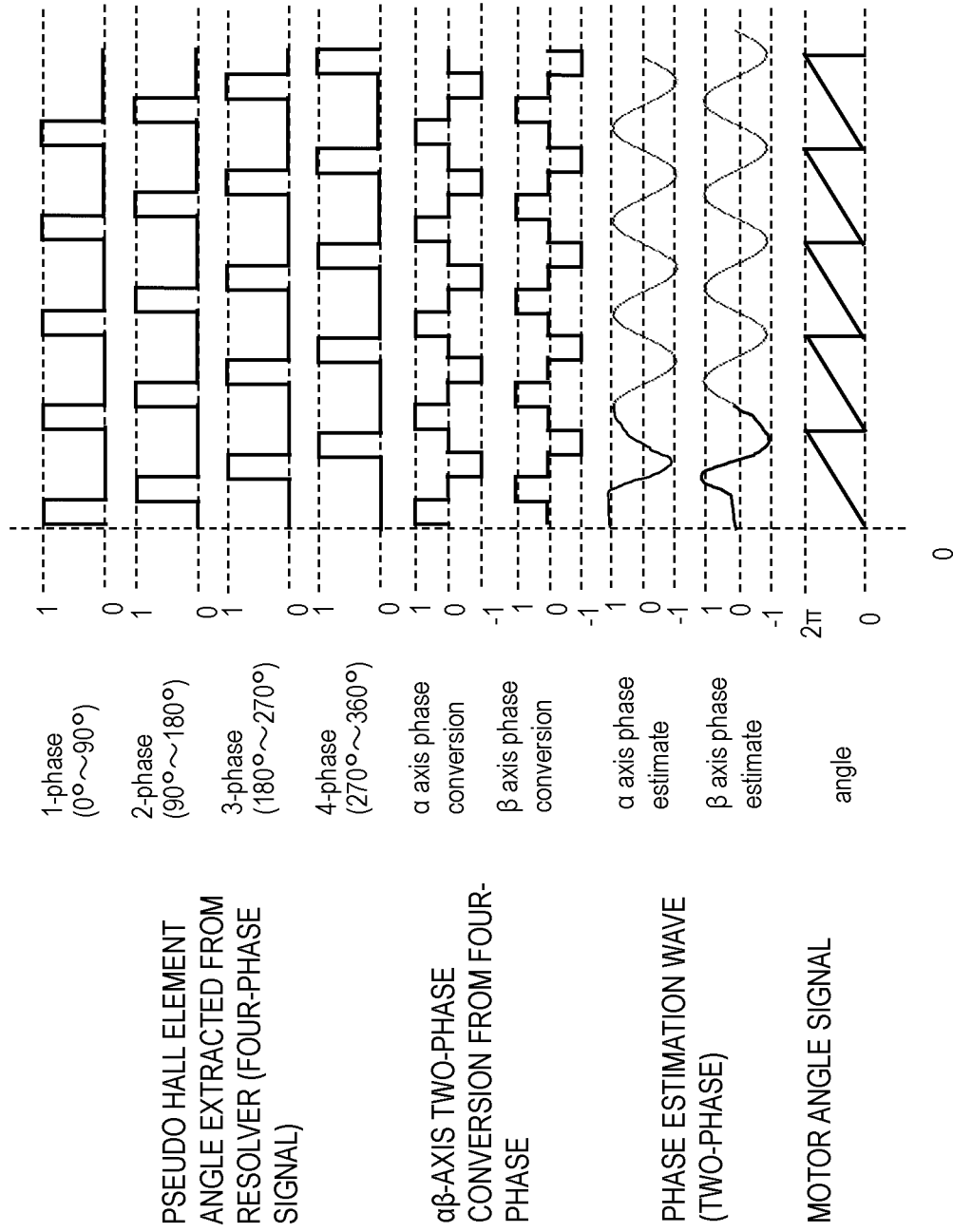
FIG. 8 is a wave-form diagram for explaining the operation of the motor control device according to fourth embodiment.

In first to third embodiments, the motor control device is operating by switching between normal mode (motor angular calculation) and diagnostic mode. In this fourth embodiment, while the resolver angle information is detected, the resolver output signal is software-processed by Microcontroller to complement the resolver angle information as a sine wave, and the angle can be estimated. Non-Patent Document 2 describes a technique that enables phase and velocity estimation by converting signals from Hall elements into 2×1 vector signals and processing them with a tracking observer. Although the Hole element is used in the non-Patent Document 2, a signal corresponding to the Hall element can be extracted from the resolver output signal in a pseudo manner. In FIG. 8, the angles of 90 degrees are extracted and displayed (90*4=360, which will be described later). The signals are 4-phase (90*4=360). A sinusoidal signal can be extracted by software processing to the signals. Thus, the phase estimation waveform (angle estimation information) is obtained, even while the resolver converter is performing diagnosis of damage waves, it is possible to drive the motor by vector control.

Figure 9:
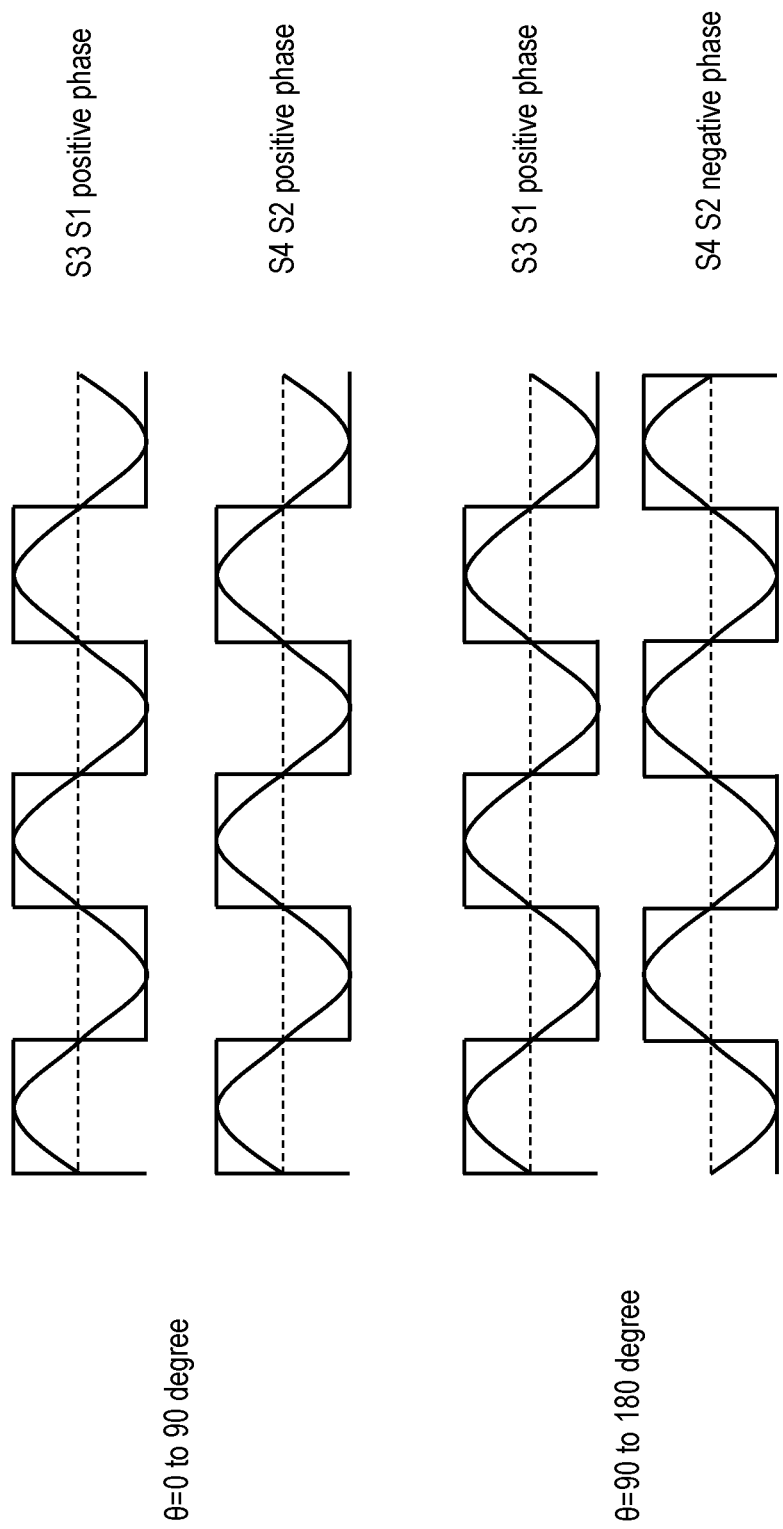
FIG. 9 is a wave-form diagram for explaining the operation of the motor control device according to fourth embodiment.

The extraction of the signals at the angles of 90 degrees described above is performed as follows. The phase of the resolver output signal changes with the motor angle. As in Expression (3), the excitation signal sin ($\omega$*t) is multiplied with the motor angle signal sin ($\omega$m*t), so that a polarity of the resolver output signal reflects the angle of the motor angle signal sin ($\omega$m*t) with respect to the excitation signal. This phase change is shown in FIG. 9.

Depending on the motor angle, the polarity of the COS and SIN signals becomes positive phase or negative phase. By determining the positive or negative phase by the zero-cross detection comparators 216 and 217, coarse accuracy angular information of the four phases without angle calculation in Resolver converter 105 is obtained. Incidentally, the excitation signal may be generated based on the PWM signal in the actual circuit. More specifically, the excitation signal source 214 generates a PWM signal based on the output signal of clock generator 215. The generated PWM-signal becomes a sinusoidal current by the coil of Resolver 104. In this case, the zero-cross detection comparator 218 outputs 0 or 1 in the period of the PWM signal corresponding to the SIN wave which is the excitation signal. Accordingly, the zero-cross detection comparator 218 may operate at the outputs of clock generator 215.

Figure 10:
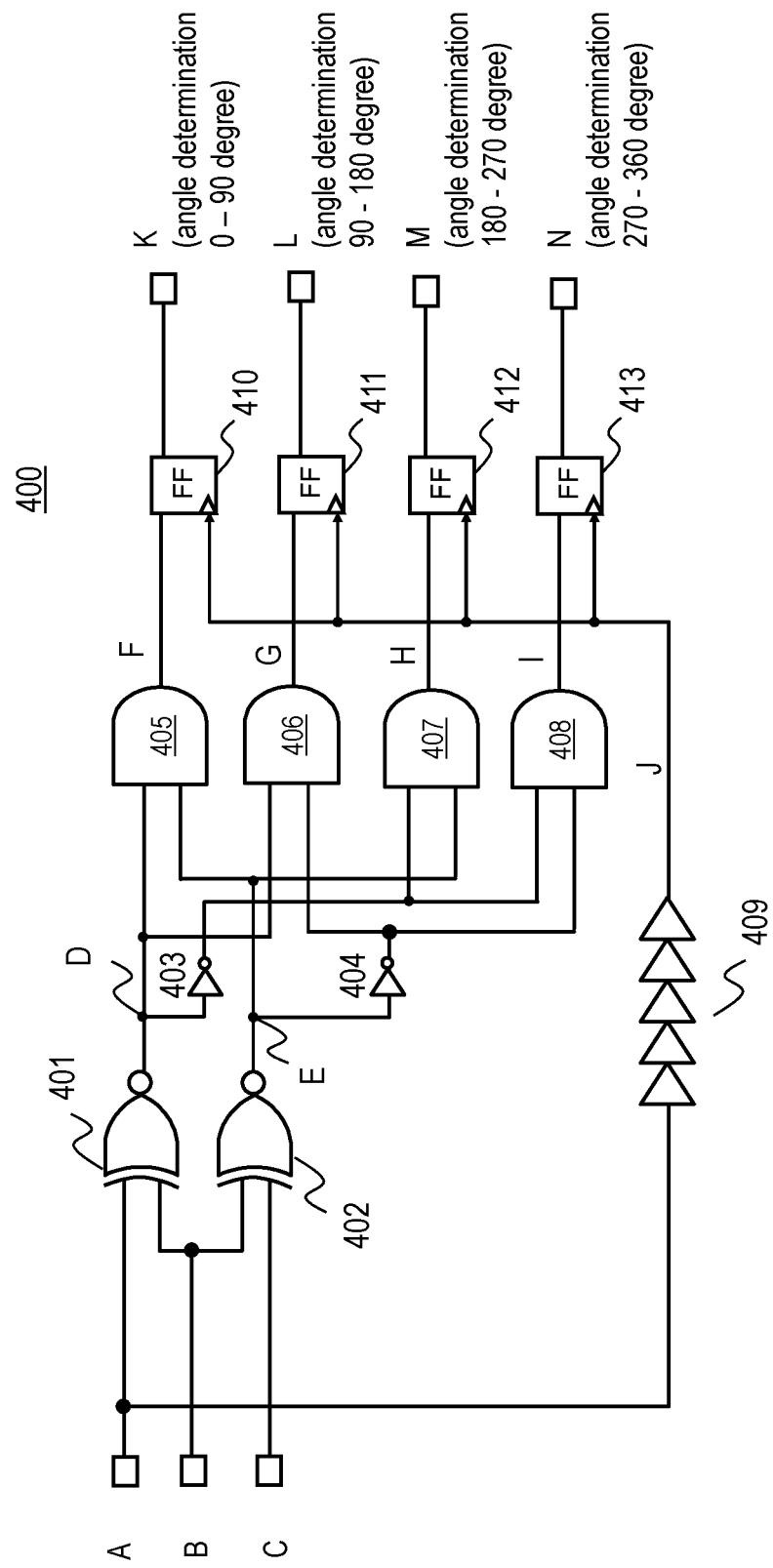
FIG. 10 is a block diagram of a pseudo-Hole-element-signal extraction circuit according to fourth embodiment.

FIG. 10 is a specific example of a circuit 400 for extracting 4-phase pseudo-Hall-element signals from the resolver signal. The pseudo-Hall-element-signal extraction circuit 400 is composed of EX-OR circuits 401, 402, inverters 403, 404, AND circuits 405 to 408, delay circuit 409, and flip-flops 410 to 413 as shown in FIG. 10.

Figure 12:
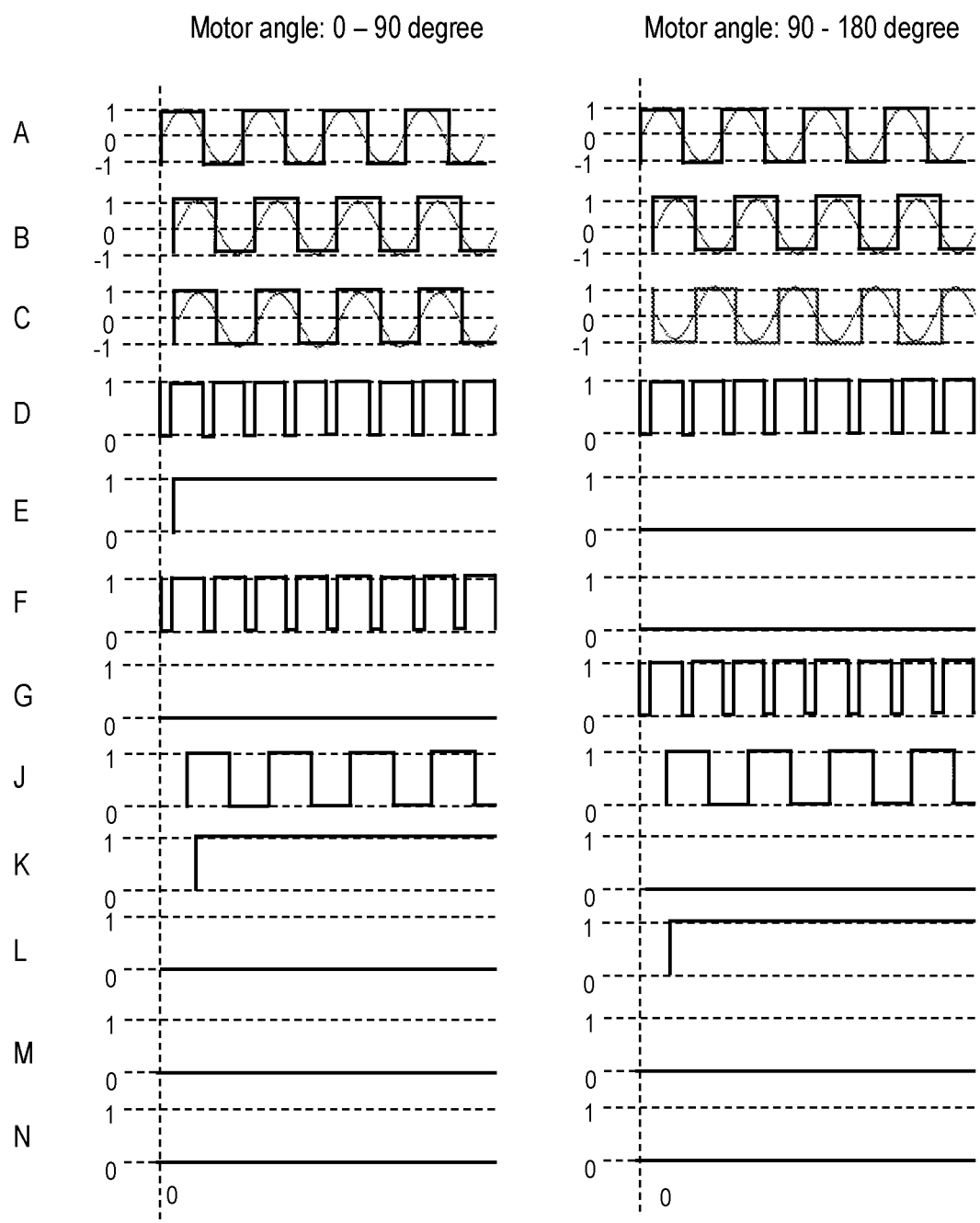
FIG. 12 is a timing chart for explaining the operation of the pseudo-Hall-element-signal extraction circuit according to fourth embodiment.

Next, the operation of the pseudo-Hall-element-signal extraction circuit 400 will be described. FIG. 11 is a table for explaining the operation of the pseudo-Hall-element-signal extraction circuit 400. FIG. 12 is a timing chart for explaining the operation of the pseudo-Hall-element-signal extraction circuit 400. Signal D (node D) is 1 if the signal A (output signal of the zero-cross detection comparator 218) and the signal B (output signal of the zero-cross detection comparator 217) are in-phase. The signal D is 0 if they are not in-phase. Signal E (node E) is 1 if the signal B and the signal C (the output signal of the zero-cross detection comparator 216) are in-phase. The signal E is 0 if they are not in-phase.

As shown in FIG. 11, the signals D and E indicate values depending on the motor angle. Whether the signals are in phase or not in phase is determined based on the signal A. When the motor angle is 0 to 90 degrees, the signal K becomes 1, and the signals L, M, and N become 0. When the motor angle is 90 to 180 degrees, the signal L becomes 1, and the signals K, M, and N become 0. When the motor angle is 180 to 270 degrees, the signal M becomes 1, and the signals K, L, and N become 0. When the motor angle is 270 to 360, the signal N becomes 1, and the signals K, L, and M become 0. That is, by observing the output signals of the pseudo-Hall-element-signal extraction circuit 400, it is possible to determine the angle of Motor 103.

By providing Microcontroller with FFT (Fast Fourier Transform) or DFT (Discrete Fourier Transform) function (hardware/software), noises having specified frequencies can be detected. However, when computing in real time by Microcontroller, high-speed ADC, dedicated circuits, and large-scale memories are required. On the other hand, in the fourth embodiment, since the FFT or the DFT is not used, the load on Microcontroller can be reduced.

Microcontroller can perform motor control by vector sensorless control without angular information. However, the control using the pseudo-Hall-sensor signal obtained from the resolver output signal has the following advantages. Motor constants do not need to be matched. There is no dependence on the motor constant. There is no slow response degradation (vector sensorless control using induced electromotive force is less effective at low speed). Therefore, when implementing the friction detection function, the control using the pseudo-Hall-sensor signal obtained from the resolver output signal reduces the system requirements for Microcontroller.

As described above, the motor control device according to fourth embodiment can calculate the motor angle in the diagnostic mode in addition to the effect of first embodiment.

Fifth Embodiment

Figure 13:
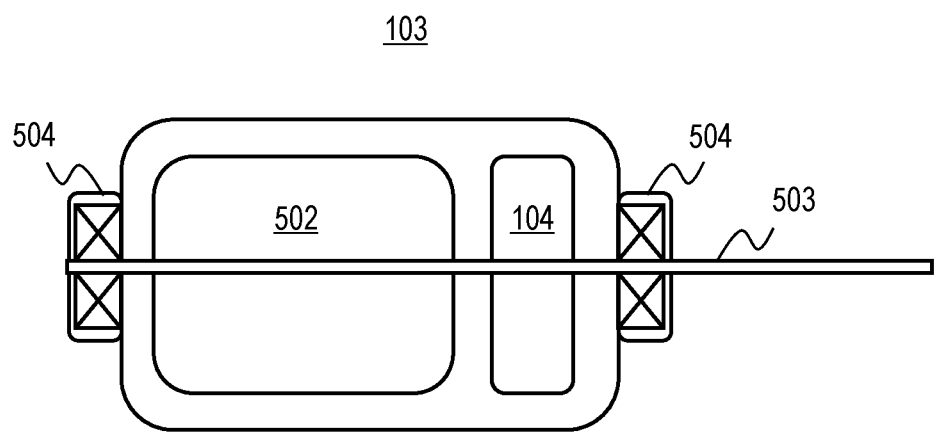
FIG. 13 is a diagram for explaining a Resolver according to fifth embodiment.
Figure 14:
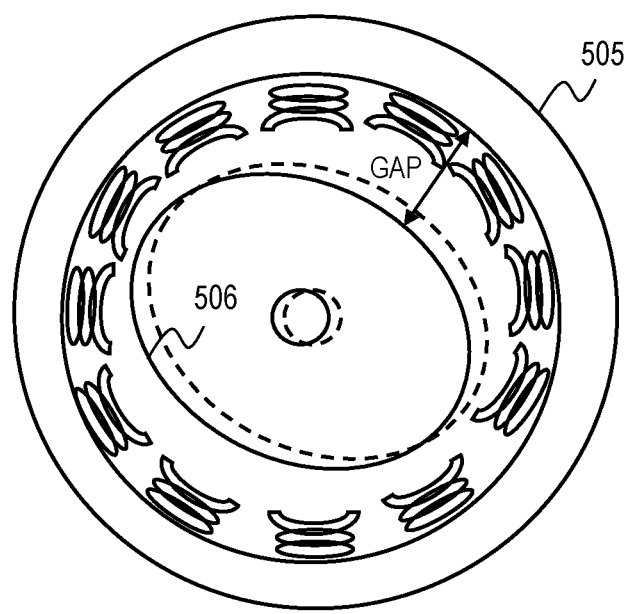
FIG. 14 is a diagram for explaining the Resolver according to fifth embodiment.

FIG. 13 is a cross-sectional view of Motor 103 used in fifth embodiment. FIG. 14 is a cross-sectional view of Resolver 104. Motor 103 includes a rotor 502, a motor output shaft 503, and bearings 504. Resolver 104 is installed on the motor output shaft 503 (a side to which a motor load is connected). If damage and friction occur in the bearing holding the motor output shaft 503, eccentricity occurs in the motor output shaft 503. The constant of the magnetoresistance of Resolver 104 is determined by the gap between the resolver rotor 505 and the resolver stator 506. The gap is prone to change in an area prone to friction. Therefore, by placing Resolver 104 on the closer side to motor load, Resolver 104 easily detects the damage and friction.

As described above, in the motor control device according to the fifth embodiment, the damage occurring in Motor 103 can be detected more accurately.

It should be noted that the present invention is not limited to the above-mentioned embodiments, and various modifications can be made without departing from the gist thereof.

What is claimed is:

1. A resolver converter comprising:
    a tracking loop circuit that calculates an angle θ from a resolver output signal; and
    a control and diagnosis circuit that controls the tracking loop circuit and diagnoses based on the resolver output signal,
    wherein the control and diagnosis circuit, by operating the tracking loop circuit as a direct digital synthesizer (DDS), synchronously detects a noise signal superimposed on the resolver output signal.

2. The resolver converter according to claim 1,
    wherein the tracking loop circuit comprising:
        first and second multipliers;
        a subtractor that subtracts an output of the second multiplier from an output of the first multiplier;
        a comparator coupled to the subtractor;
        a synchronous detection circuit coupled to the comparator;
        a proportional and integral (PI) control circuit coupled to the synchronous detection circuit;
        a phase accumulator and DDS circuit coupled to the PI control circuit;
        a first low-pass filter coupled to the first multiplier;
        a second low-pass filter coupled to the second multiplier;
        an amplifier coupled to the first and second low-pass filters; and
        an analog-to-digital converter (ADC) coupled to the amplifier,
    wherein when the tracking loop circuit calculates the angle θ:
        the phase accumulator and DDS circuit operates as a phase accumulator,
        the first multiplier multiplies a first signal including a SIN θ of the resolver output signal by a COS wave outputted from the phase accumulator and DDS circuit, and
        the second multiplier multiplies a second signal including a COS θ of the resolver output signal by a SIN wave outputted from the phase accumulator and DDS circuit,
    wherein when the tracking loop circuit operates as the DDS:
        the phase accumulator and DDS circuit operates as the DDS,
        the first multiplier multiplies one of the first and second signals by a COS wave outputted from the phase accumulator and DDS circuit, and
        the second multiplier multiplies one of the first and second signals by a SIN wave outputted from the phase accumulator and DDS circuit.

3. The resolver converter according to claim 1, further comprising:
    a first differential amplifier circuit that amplifies the first signal; and
    a second differential amplifier circuit that amplifies the second signal.

4. The resolver converter according to claim 3, further comprising:
    a first zero-cross detection comparator coupled to an output of the first differential amplifier circuit; and
    a second zero-cross detection comparator coupled to an output of the second differential amplifier circuit.

5. The resolver converter according to claim 4,
    wherein the angle θ is estimated based on outputs of the first and second zero-cross detection comparators.

6. The resolver converter according to claim 1, further comprising:
    a first alias filter that filters the first signal; and
    a second alias filter that filters the second signal.

7. A motor control device comprising:
    a resolver that outputs an output signal in accordance with a rotation angle θ of a motor; and a resolver converter that receives the output signal of the resolver, wherein the resolver converter comprising:
a tracking loop circuit that calculates the rotation angle θ from the output signal of the resolver; and
a control and diagnosis circuit that controls the tracking loop circuit and diagnoses based on the output signal of the resolver, wherein the control and diagnosis circuit, by operating the tracking loop circuit as a direct digital synthesizer (DDS), synchronously detects a noise signal superimposed on the output signal of the resolver.

8. The motor control device according to claim 7,
wherein the tracking loop circuit comprising:
first and second multipliers;
a subtractor that subtracts an output of the second multiplier from an output of the first multiplier;
a comparator coupled to the subtractor;
a synchronous detection circuit coupled to the comparator;
a proportional and integral (PI) control circuit coupled to the synchronous detection circuit;
a phase accumulator and DDS circuit coupled to the PI control circuit;
a first low-pass filter coupled to the first multiplier;
a second low-pass filter coupled to the second multiplier;
an amplifier coupled to the first and second low-pass filters;
an analog-to-digital converter (ADC) coupled to the amplifier, wherein when the tracking loop circuit calculates the rotation angle θ:
the phase accumulator and DDS circuit operates as a phase accumulator,
the first multiplier multiplies a first signal including a SIN θ of the output signal of the resolver by a COS wave outputted from the phase accumulator and DDS circuit, and
the second multiplier multiplies a second signal including a COS θ of the output signal of the resolver by a SIN wave outputted from the phase accumulator and DDS circuit, wherein when the tracking loop circuit operates as the DDS:
the phase accumulator and DDS circuit operates as the DDS,
the first multiplier multiplies one of the first and second signals by a COS wave outputted from the phase accumulator and DDS circuit, and
the second multiplier multiplies one of the first and second signals by a SIN wave outputted from the phase accumulator and DDS circuit.

9. The motor control device according to claim 7, further comprising:
a first differential amplifier circuit that amplifies the first signal; and
a second differential amplifier circuit that amplifies the second signal.

10. The motor control device according to claim 9, further comprising:
a first zero-cross detection comparator coupled to an output of the first differential amplifier circuit; and
a second zero-cross detection comparator coupled to an output of the second differential amplifier circuit.

11. The motor control device according to claim 10,
wherein the rotation angle θ is estimated based on outputs of the first and second zero-cross detection comparators.

12. The motor control device according to claim 7, further comprising:
a first alias filter that filters the first signal; and
a second alias filter that filters the second signal.

13. The motor control device according to claim 7, further comprising:
a motor;
wherein the motor includes a motor output shaft,
wherein the resolver is installed on a side of the motor output shaft to which a motor load is to be coupled.

\* \* \* \* \*